United States Patent
Takaoka

(10) Patent No.: US 7,189,655 B2
(45) Date of Patent: Mar. 13, 2007

(54) METHOD OF CORRECTING AMPLITUDE DEFECT IN MULTILAYER FILM OF EUVL MASK

(75) Inventor: Osamu Takaoka, Chiba (JP)

(73) Assignee: SII Nano Technology Inc., Chiba (JP)

(*) Notice: Subject to any disclaimer, the term of this patent is extended or adjusted under 35 U.S.C. 154(b) by 0 days.

(21) Appl. No.: 11/195,982

(22) Filed: Aug. 2, 2005

(65) Prior Publication Data

US 2006/0040418 A1    Feb. 23, 2006

(30) Foreign Application Priority Data

Aug. 17, 2004  (JP)  .............................. 2004-236941

(51) Int. Cl.
*H01L 21/302*  (2006.01)
(52) U.S. Cl. ................................ 438/706; 257/E21.218
(58) Field of Classification Search ............... 438/5, 438/7, 10–11, 14, 16–18, 20, 22–24, 29, 31, 438/34–36, 128–130, 149, 459, 484, 538, 438/607, 706, 712, 717, 725, 787

See application file for complete search history.

(56) References Cited

U.S. PATENT DOCUMENTS

| 4,609,809 A | * | 9/1986 | Yamaguchi et al. ... 219/121.35 |
| 5,083,033 A | * | 1/1992 | Komano et al. ......... 250/492.2 |
| 6,967,168 B2 | * | 11/2005 | Stearns et al. .............. 438/706 |

* cited by examiner

*Primary Examiner*—Michael Lebentritt
*Assistant Examiner*—Andre' Stevenson
(74) *Attorney, Agent, or Firm*—Brinks Hofer Gilson & Lione

(57) ABSTRACT

By entering a low acceleration Si ion beam of 500 V or lower or a low acceleration Si ion beam of 500 V-2000 V having been slanted such that an injection depth becomes shallow, which has been mass-separated from a liquid alloy ion source containing Si by a mass separator and converged by an ion optical system, the amplitude defect near a surface of the Mo/Si multilayer film or the $Mo_2C$/Si multilayer film is removed by a physical sputter or a gas assist etching such that an interlayer of the Mo/Si multilayer film or the $Mo_2C$/Si multilayer film in a lower layer is not destroyed.

7 Claims, 3 Drawing Sheets

FIG. 2A
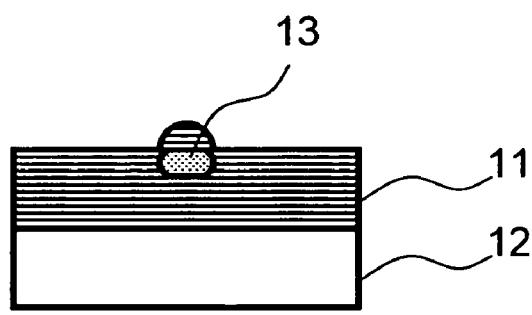
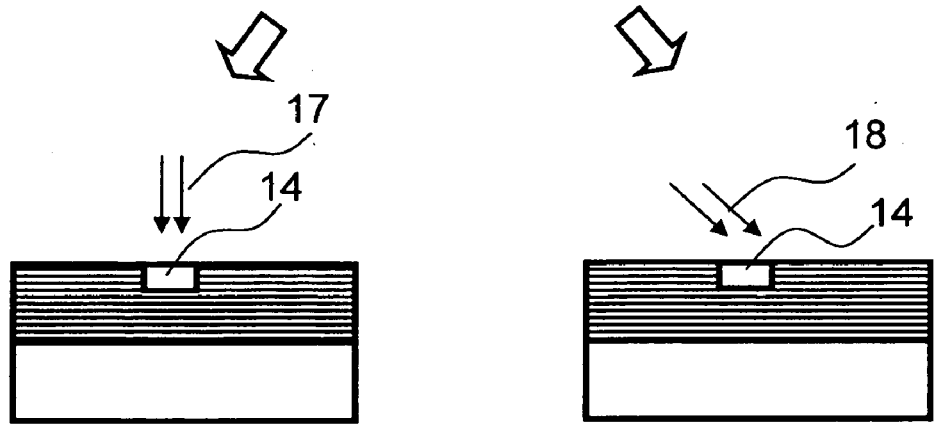
FIG. 2B　　　　　FIG. 2C

FIG. 3A
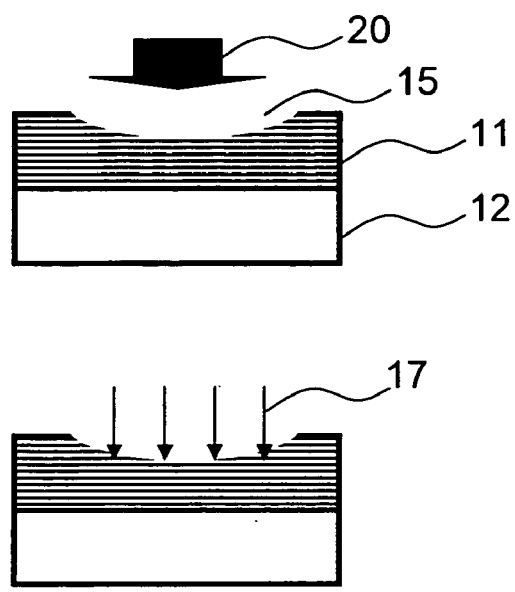
FIG. 3B
FIG. 4
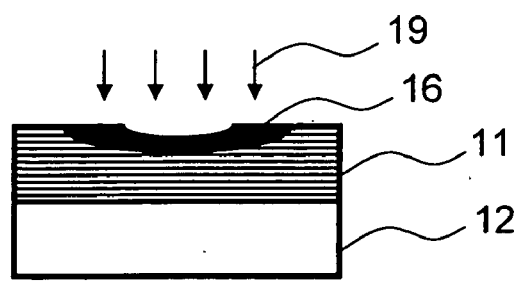

METHOD OF CORRECTING AMPLITUDE DEFECT IN MULTILAYER FILM OF EUVL MASK

This application claims priority under 35 U.S.C. § 119 to Japanese Patent Application No. 2004-236941 filed Aug. 17, 2004, the entire content of which is hereby incorporated by reference.

BACKGROUND OF THE INVENTION

The present invention relates to a method of correcting an amplitude defect of an Mo/Si multilayer film or an $Mo_2C/Si$ multilayer film of an EUVL mask by a focused ion beam.

At present, an optical projection exposure apparatus using KrF of wavelength 248 nm or an ArF eximer laser of wavelength 193 nm is used in a pattern transcription to a wafer. Recently, there is reported a possibility of capable of dealing with till 65 nm rule or 45 nm rule in half pitch by using in combination a liquid immersion technique in which a resolving power is improved by filling between an objective lens of the projection exposure apparatus and the wafer with a medium of high refractive index and an ultra-resolution technique such as deformation illumination and Levenson-type phase-shift mask. However, on and after 32 nm rule, since it reaches a resolution limit, there is proposed a new transcription method like a soft X-ray reduction exposure (Extreme Ultra Violet Lithography, EUVL) in which an exposure wavelength has been extremely shortened. The EUVL is a technique for performing the exposure by reducing the soft X-ray of about 13.5 nm in wavelength to ¼ by a reflection optical system and deemed to be a limit of shortening the wavelength of an ultraviolet exposure, and recently it especially gets attention as a lithography technique capable of being utilized over two or more generations of 45 nm rule or on and after 32 nm rule.

An EUVL mask is constituted by an Mo/Si multilayer film consisting of by-layers of 40–60 layers of about 7 nm cycles in which Mo and Si have been alternately laminated in order to reflect an EUV light having entered onto a low expansion glass (quartz) substrate, an absorber of about 70 nm made of a binary or ternary film containing a heavy metal, such as TaN or TaBN or TaGeN, bearing a function of absorbing the EUV light and transcribing a pattern shape, and a buffer layer which exists between the absorber and the Mo/Si multilayer film and is made of $SiO_2$ or Cr or CrN of about 30 nm for protecting the Mo/Si multilayer film at a dry etching time of an absorber pattern (Non-patent Document 1). Since the Mo/Si multilayer film is weak against a heat and there is required a manufacturing process whose temperature is considerably low and there is also a variation with time, recently there is proposed also the $Mo_2C/Si$ multilayer film which is excellent in its heat resistance and in which no variation with time exists (Non-patent Document 2).

As to the EUVL mask, besides a pattern abnormal defect of the absorber pattern, there is reported a defect of the Mo/Si multilayer film (or $Mo_2C/Si$ multilayer film). It is known that, in the defect of the Mo/Si multilayer film (or $Mo_2C/Si$ multilayer film), there are the amplitude defect (this decreases an intensity of EUV reflected light) generated by the fact that a foreign matter and the like are mixed in a place near a multilayer film surface, and a phase defect generated by the fact that the foreign matter and the like are mixed on a glass substrate or at an initial time of a deposition of the multilayer film (Non-patent Document 3). It is necessary that the amplitude defect and the phase defect are removed before film-forming the absorber and the buffer layer. There is also proposed a method of detecting the amplitude defect and the phase defect while distinguishing them by utilizing a difference in through-focus characteristic of the light (Non-patent Document 3).

As to the defect of the absorber pattern of the EUVL mask, there is reported a method of correcting it by the focused ion beam similarly to a photomask. As a method of correcting the amplitude defect of the Mo/Si multilayer film (or $Mo_2C/Si$ multilayer film), there is proposed a correcting method by an etching of the foreign matter in the multilayer film by a low acceleration Ar beam and a capping layer formation for Mo film oxidation prevention by an Ar beam Si sputter film (Non-patent Document 3). As a method of correcting the phase defect of the Mo/Si multilayer film (or $Mo_2C/Si$ multilayer film), there is proposed a method of correcting it by forming silicide in an Mo/Si interface by heating by an electron beam to thereby relieve a step having been generated in the Mo/Si multilayer film (Non-patent Document 3).

In the above proposed method of correcting the amplitude defect of the Mo/Si multilayer film (or $Mo_2C/Si$ multilayer film), although the Ar ion beam of 500 V is used, since a gas ion source is large in its light source size and additionally used in the low acceleration, it is impossible to converge the ion beam, so that there has been a problem that a foreign matter periphery is widely shaved. Further, there have been problems that, in order to film-form the capping layer, it is necessary to dispose an Si target for the sputter to a suitable position near the mask, additionally it is also necessary to adjust sputtered Si so as to be deposited to a desired position, and further an Si film is adhered to an unnecessarily wide region because it is a sputter film.

[Non-patent Document 1] T. Shoki, T. Kinoshita, N. Sakaya, M. Hosoya, R. Ohkubo, Y. Usui, H. Kobayashi, and O. Nagarekawa, J. Vac. Sci. Technol. B21 3021–3026 (2003)

[Non-patent Document 2] S. Yulin, T. Kuhlmann, T. Feigal, and N. Kaiser, Proceedings of SPIE 4343 607–613 (2001)

[Non-patent Document 3] A. Barty, P. B. Mirkarimi, D. G. Stearns, D. Sweeney, H. N. Chapman, M. Clift, S. Hector, and M. Yi, Proceedings of SPIE 4688 385–394 (2002)

It is an object of the present invention to correct the amplitude defect in the Mo/Si multilayer film or the $Mo_2C/Si$ multilayer film of the EUVL mask.

SUMMARY OF THE INVENTION

By using an apparatus having an Au—Si liquid alloy ion source, a mass separator and a focused ion optical system, an ion beam drawn out of the Au—Si liquid alloy ion source is separated only in Si by the mass separator, after having been converged by the ion optical system an Si ion beam having been decelerated to a low acceleration voltage of 500 V or lower such that an injection depth becomes less than a thickness of the multilayer film is irradiated to the Mo/Si multilayer film or the $Mo_2C/Si$ multilayer film in which the amplitude defect exists, and the multilayer film in an upper layer of a foreign matter constituting the amplitude defect and the foreign matter are removed by a physical sputter or a gas assist etching such that an interlayer of the Mo/Si multilayer film or the $Mo_2C/Si$ multilayer film in a lower layer is not destroyed.

Instead of decreasing an energy of the Si ion beam to be irradiated, the Si ion beam of 500 V–2000 V in acceleration voltage is slantingly entered such that the injection depth becomes shallow to thereby irradiate the Si ion beam to the Mo/Si multilayer film or the $Mo_2C/Si$ multilayer film in which the amplitude defect exists such that the injection depth becomes less than the thickness of the multilayer film, and the multilayer film in the upper layer of the foreign matter constituting the amplitude defect and the foreign matter are removed by the physical sputter or the gas assist etching such that the interlayer of the Mo/Si multilayer film or the $Mo_2C/Si$ multilayer film in the lower layer is not destroyed.

With respect to a place in which a step is large by removing the foreign matter, an etching is performed so as to become a Gaussian shape as a whole by removing the multilayer film around a foreign matter removal place. By doing like this, it is possible to reduce a reflectivity from being lost by a scattering at an EUV light reflection time. In order to make it the Gaussian shape, it is reduced to the low acceleration voltage of 500 V or lower, and a defocused ion beam of the Gaussian beam shape is used. By using this ion beam, shaving is collectively performed by the physical sputter or the gas assist etching. Or, an ion beam which has been converged and reduced to the low acceleration voltage of 500 V or lower is scan-irradiated, and an ion irradiation quantity is controlled in compliance with a place so as to become the Gaussian shape to thereby perform the shaving by the physical sputter or the gas assist etching.

In the above, in order to reduce the reflectivity from being lost by the scattering at the EUV light reflection time, it is desirable that the Gaussian shape is made as gentle as possible.

In a place in which the amplitude defect near a surface of the Mo/Si multilayer film or the Mo.sub.2C/Si multilayer film has been removed by the etching so as to become the gentle Gaussian shape, as an oxidation prevention of an Mo film there is formed a capping layer by consistently, directly depositing Si in the vacuum by the Si ion beam whose acceleration voltage has been decreased to single digit voltage to tens of volts.

[Advantages of the Invention] Since the Si ion beam having been decelerated to the low acceleration voltage of 500 V or lower is used in order that the injection depth becomes less than the thickness of the multilayer film, or since the amplitude defect is removed by irradiating the ion beam of 500 V–2000 V in acceleration voltage by the slanting incidence, there is no fact that the interface of the multilayer film is disarranged by the injection of the Si ion and thus the reflectivity is decreased. Further, even if the irradiated ion beam is injected into the multilayer film, since it is Si that is a light element, there is no fact that the EUV light is absorbed.

In a place in which the amplitude defect has been removed by the physical sputter, since the capping layer is formed in a vacuum intact without exposure to the air by directly depositing Si by the Si ion beam whose acceleration voltage has been decreased to single voltage to tens of volts, it is possible to surely perform the oxidation prevention of the Mo film. It is neither necessary to dispose, like a case where an Si capping layer is formed by separately using a sputter target of Si, the Si target to a suitable position near a mask, nor necessary to adjust such that sputtered Si becomes a desired position. Further, since the beam is converged in comparison with the sputter, a position controllability is good as well.

BRIEF DESCRIPTION OF THE DRAWINGS

FIGS. 2A, 2B and 2C are views explaining a method of removing a foreign matter of an amplitude defect.

FIGS. 3A–3B are views explaining a method of gently shaving a multilayer film around a foreign matter removal place such that a reflectivity is not lost by a scattering at an EUV light reflection time.

FIG. 4 is a view explaining a method of forming a capping layer for an oxidation prevention of an Mo film in the multilayer film.

DETAILED DESCRIPTION OF THE INVENTION

Figure 1:
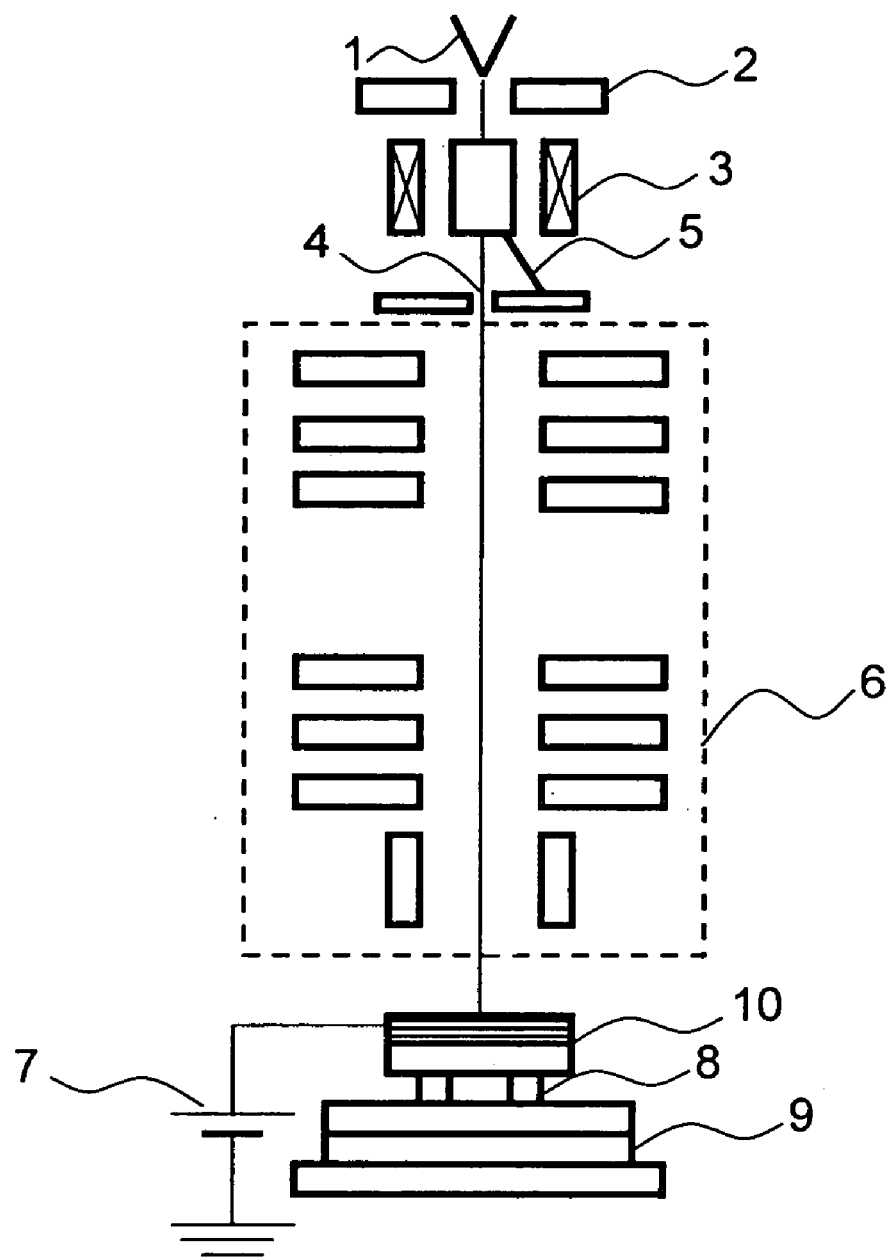
FIG. 1 is a system schematic view best showing a characteristic of the present invention.

Hereunder, it is explained about an embodiment of the present invention by referring to the drawings.

FIG. 1 is a schematic sectional view of a focused ion beam apparatus used in the present invention.

After film-forming the Mo/Si multilayer film (or $Mo_2C/Si$ multilayer film), an EUVL mask 10, in which there has been found, by a survey instrument, the amplitude defect which has been made by the fact that the foreign matter is mixed to a vicinity of the multilayer film surface and decreases the intensity of EUV reflected light, is introduced into a vacuum apparatus having an AU—Si liquid alloy ion source 1, a mass separator 3, a focused ion optical system 6 and a high accuracy XY stage 9, and the XY stage 9 is moved such that a position in which the amplitude defect has been found comes to a visual field center. An electrode is formed in an end part of the Mo/Si multilayer film (or $Mo_2C/Si$ multilayer film) so as to be capable of intending to decrease an acceleration voltage by a retarding (the retarding means the fact that an ion beam effective acceleration voltage on a sample is decreased by applying a voltage to the sample), and it is adapted such that a retarding voltage (plus voltage) is applied with the whole of a mask being electrically floated by an insulating material 8. The beam can be converged even by a low acceleration voltage because the Au—Si liquid alloy ion source is small in its light source size, an energy spread is small as well and, additionally in a retarding optical system (this means an ion optical system in which the retarding has been added to a conventional ion optical system, and a high acceleration is performed till a midway and a deceleration just before a sample), the ion beam is converged by a high acceleration voltage till just before the sample and decelerated just before the sample.

In the position in which the amplitude defect has been found, ions 5 other than Si ions are removed and only an Si beam 4 is separated by the mass separator 3 like E×B from the ion beam drawn out of the Au—Si liquid alloy ion source 1 by a voltage of a drawing-out electrode 2, and the separated Si ion beam is accelerated from several kV to 30 kV and converged by the ion optical system 6. The mass separator may be disposed in a crossover point of the ion beam in an intermediate of a condenser lens and an objective lens of the ion optical system, even not between the ion source and the optical system.

FIGS. 2A–2C are views explaining a method of removing the foreign matter of the amplitude defect according to the present invention.

By decelerating the converged Si ion beam 4 by applying a sample bias 7 till such a low acceleration voltage of 500 V or lower that an injection depth becomes less than a thickness of the multilayer film to thereby irradiate it to the Mo/Si multilayer film or the $Mo_2C/Si$ multilayer film 11 on a glass substrate 12 (FIG. 2A) in which the amplitude defect exists, a foreign matter 13 having the multilayer film in an upper layer and becoming a cause of the amplitude defect is removed by a physical sputter by an ion beam 17 or a gas assist etching using a halogen-based gas such that an interface of the Mo/Si multilayer film or the Mo$_2$C/Si multilayer film 11 in a lower layer is not destroyed (FIG. 2B). Or, instead of the Si ion beam 17 whose energy has been decreased to 500 V or lower, by irradiating such an Si ion beam 18 that the injection depth becomes less than the thickness of the multilayer film 11 to the the Mo/Si multilayer film or the Mo$_2$C/Si multilayer film in which the amplitude defect exists by slantingly entering the Si ion beam at the acceleration voltage of 500 V–2000 V such that the injection depth becomes shallow, the multilayer film in the upper layer of the foreign matter 13 becoming the cause of the amplitude defect and the foreign matter 13 may be removed by the physical sputter or the gas assist etching using the halogen-based gas such that the interface of the Mo/Si multilayer film or Mo$_2$C/Si multilayer film in the lower layer is not destroyed (FIG. 2C). Even if the irradiated Si ion beam is injected into the Mo/Si multilayer film or the Mo$_2$C/Si multilayer film, since it is Si that is the light element, there is no fact that the EUV light is absorbed at an exposure time.

FIGS. 3A–3B are views explaining a method of gently shaving the multilayer film around a foreign matter removal place in order that the reflectivity is not lost by the scattering at the EUV light reflection time.

In a foreign matter removal place 14 in which a step generated by removing the foreign matter 13 by the process of FIGS. 2A–2C is large, there is formed a concavity 15 such that its section becomes a Gaussian shape as a whole by shaving the multilayer film around the foreign matter removal place 14 such that the above step becomes null. At this time, it is desirable to make the Gaussian shape as gentle as possible. In order that it becomes the concavity 15 of the gentle Gaussian shape, by shaving it by the physical sputter by an ion beam 20 which has been made the gentle Gaussian shape by defocusing the low acceleration Si ion beam of several 100 V having been mass-separated or the gas assist etching using the halogen-based gas (FIG. 3A), or, by controlling an Si ion irradiation quantity in compliance with a place such that it becomes the gentle Gaussian shape by scanning the converged beam 17, it is shaved by the physical sputter or the gas assist etching using the halogen-based gas (FIG. 3B). Even if the irradiated Si ion beam is injected into the Mo/Si multilayer film or the Mo$_2$C/Si multilayer film, since it is Si that is the light element, there is no fact that the EUV light is absorbed.

Here, the gentle Gaussian shape means such a gentle Gaussian shape that the reflectivity is not lost by the scattering at the EUV light reflection time, and it follows that the larger a diameter of the concavity 15 is with respect to a depth of the concavity 15, the more gentle it is.

FIG. 4 is a view explaining a method of forming, in a Gaussian shape portion formed in FIGS. 3A–3B, a capping layer for the oxidation prevention of the Mo film in the multilayer film.

In the place 15 in which the multilayer film has been removed by the above process of FIG. 3A or FIG. 3B such that it becomes the gentle Gaussian shape, there is formed, for the oxidation prevention of the Mo film in the multilayer film, a capping layer 16 by consistently, directly depositing Si in a vacuum by an Si ion beam 19 whose acceleration voltage has been decreased to single voltage to tens of volts (FIG. 4). According to this method, there arises no problem that, like in the Non-patent Document 3, it is necessary to dispose the Si target to the suitable position near the mask in the case of forming the capping layer by Si coming out by impinging the Ar ion beam against the Si target for the sputter. Further, it is also unnecessary to adjust an Si target position, an incident beam position and the like such that sputtered Si is deposited on the place 15 having been shaved in the Gaussian shape. Further, in comparison with such a sputter system as in the Non-patent Document 3, since the low acceleration Si ion beam 19 is converged, the position controllability is good as well. After forming the capping layer 16, the EUVL mask in which the amplitude defect near the surface of the Mo/Si multilayer film or the Mo$_2$C/Si multilayer film has been corrected is taken out of the vacuum apparatus having the AU-Si liquid alloy ion source, the mass separation instrument and the focused ion optical system.

What is claimed is:

1. A method of correcting an amplitude defect in an EUVL mask comprising Mo/Si or Mo$_2$C/Si multilayered films, the method comprising:
    separating a Si ion beam from ion beams coming out from a liquid alloy ion source containing Si;
    focusing the Si ion beam onto a foreign object present in the films;
    controlling a voltage of the Si ion beam to 500 V or lower; and
    irradiating the Si ion beam having the controlled voltage to the foreign object to remove the foreign object.

2. A method according to claim 1, wherein removing the foreign object comprises removing the foreign object by physical sputtering.

3. A method according to claim 1, wherein removing the foreign object comprises removing the foreign object by gas assist etching.

4. A method according to claim 1, wherein controlling a voltage of the Si ion beam to 500 V or lower comprises accelerating the Si ion beam and decelerating the voltage to 500 V or lower near the films by applying a retarding voltage to the EUVL mask.

5. A method according to claim 1, further comprising defocusing the Si ion beam to form a hole of a Gaussian shape in the films at a place where the foreign object has been removed.

6. A method according to claim 5, further comprising lowering the voltage of the Si ion beam to single digit voltage to tens of volts and focusing the Si ion beam of the lowered voltage onto the hole to deposit Si in order to cap the hole with an Mo film oxidation prevention layer.

7. A method of correcting an amplitude defect in an EUVL mask comprising Mo/Si or Mo$_2$C/Si multilayered films, comprising:
    separating a Si ion beam from ion beams coming out from a liquid alloy ion source containing Si;
    focusing the Si ion beam onto a foreign object present in the films;
    controlling a voltage of the Si ion beam to 500 V to 2,000 V; and
    irradiating the Si ion beam having the controlled voltage to the foreign object at an angle of less than 90 degrees from the surface of the films to remove the foreign object.

* * * * *

UNITED STATES PATENT AND TRADEMARK OFFICE
CERTIFICATE OF CORRECTION

PATENT NO.          : 7,189,655 B2
APPLICATION NO.  : 11/195982
DATED                  : March 13, 2007
INVENTOR(S)         : Osamu Takaoka It is certified that error appears in the above-identified patent and that said Letters Patent is hereby corrected as shown below:

On the Title Page

In Column 2, after line 3, under "U.S. PATENT DOCUMENTS", insert the following,
--OTHER PUBLICATIONS Anton Barty et al., "EUVL mask blank repair," Emerging Lithographic Technologies VI, Roxann L. Engelstad, Editor, Proceedings of SPIE Vol. 4688 (2002)

S. Yulin et al., "Damage Resistant and Low Stress EUV Multilayer Mirrors," Emerging ithographic Technologies V, Elizabeth A. Dobisz, Editor, Proceedings of SPIE Vol. 4343 (2001)

Tsutomo Shoki et al., "Damage-free extreme ultraviolet mask with TaBN absorber," J. Vac. Sci. Technol. B21(6), Nov/Dec 2003--.

In the Claims

Column 6, in claim 6, lines 2-3, after "the Si ion beam to" delete "single digit voltage to" and substitute --a range from several volts to several-- in its place.

Signed and Sealed this

Thirty-first Day of July, 2007

JON W. DUDAS
*Director of the United States Patent and Trademark Office*